United States Patent
Annunziata et al.

(10) Patent No.: US 9,065,035 B2
(45) Date of Patent: Jun. 23, 2015

(54) CELL DESIGN FOR EMBEDDED THERMALLY-ASSISTED MRAM

(71) Applicant: International Business Machines Corporation, Armonk, NY (US)

(72) Inventors: Anthony J. Annunziata, Stamford, CT (US); John K. DeBrosse, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/036,707

(22) Filed: Sep. 25, 2013

(65) Prior Publication Data

US 2014/0264670 A1 Sep. 18, 2014

Related U.S. Application Data

(63) Continuation of application No. 13/830,829, filed on Mar. 14, 2013, now Pat. No. 8,917,531.

(51) Int. Cl.
  *G11C 11/02* (2006.01)
  *H01L 27/22* (2006.01)
  *H01L 43/02* (2006.01)
  *H01L 43/12* (2006.01)

(52) U.S. Cl.
  CPC ............... *H01L 43/02* (2013.01); *H01L 43/12* (2013.01); *H01L 27/228* (2013.01)

(58) Field of Classification Search
  CPC ............................ G11C 11/161; H01L 27/222
  USPC ........................................................ 365/158
  See application file for complete search history.

(56) References Cited

U.S. PATENT DOCUMENTS

| 5,940,319 | A  | * | 8/1999  | Durlam et al.    | 365/171 |
|-----------|----|---|---------|------------------|---------|
| 7,304,360 | B2 | * | 12/2007 | Guo et al.       | 257/422 |
| 7,511,990 | B2 | * | 3/2009  | Chung et al.     | 365/158 |
| 8,169,815 | B2 |   | 5/2012  | Javerliac et al. | 365/158 |
| 8,492,808 | B2 | * | 7/2013  | Omori et al.     | 257/295 |
| 8,611,141 | B2 | * | 12/2013 | Baraji et al.    | 365/158 |
| 2008/0160641 | A1 |  | 7/2008  | Min et al.       | 438/3   |
| 2009/0073750 | A1 |  | 3/2009  | Leuschner        | 365/158 |
| 2009/0316476 | A1 |  | 12/2009 | Javerliac et al. | 365/173 |
| 2012/0201074 | A1 |  | 8/2012  | Berger et al.    | 365/158 |

OTHER PUBLICATIONS

U.S. Appl. No. 13/830,829, filed Mar. 2013, Annunziata.*

* cited by examiner

*Primary Examiner* — Son Mai
(74) *Attorney, Agent, or Firm* — Ido Tuchman; Vazken Alexanian

(57) ABSTRACT

A thermally assisted magnetoresistive random access memory cell, a corresponding array, and a method for fabricating the array. An example cell includes a first metal layer, a second metal layer, an interlayer, a first magnetic stack, and a first non-magnetic via. The first metal layer includes a pad and a first metal line, with the pad not in direct contact with the first metal line. The second metal layer includes a second metal line and a metal strap. The second metal line is perpendicular to the first metal line and not in contact with the metal strap. The interlayer is located between the first and second metal layers. The first metal line is not in direct contact with the interlayer. The first magnetic stack is in direct contact with the interlayer and the metal strap. The first non-magnetic via is in direct contact with the pad and the metal strap.

7 Claims, 12 Drawing Sheets

CELL DESIGN FOR EMBEDDED THERMALLY-ASSISTED MRAM

CROSS-REFERENCE TO RELATED APPLICATIONS

This application claims priority under 35 U.S.C. §120 to U.S. patent application Ser. No. 13/830,829 filed Mar. 14, 2013, the entire text of which is specifically incorporated by reference herein.

BACKGROUND

This invention relates to thermally assisted magnetoresistive random access memory (TAS-MRAM), and more particularly, a TAS-MRAM cell structure with two mask adders.

There are two major groups in computer memory: non-volatile memory and volatile memory. Constant input of energy in order to retain information is not necessary in non-volatile memory but is required in the volatile memory. Examples of non-volatile memory devices are Read Only Memory (ROM), Flash Electrical Erasable Read Only Memory, Ferroelectric Random Access Memory, Magnetic Random Access Memory (MRAM), and Phase Change Memory (PCM); non-volatile memory devices being memory in which the state of the memory elements can be retained for days to decades without power consumption.

Embedding of non-volatile memory with a larger system of circuits often utilizes Flash memory technology. Current embedded memory solutions also tend to be expensive due to the use of many mask adders. These solutions also exhibit limited performance, such as low endurance and low maximum operating. Furthermore, cross-technology-node compatibility of current embedded memory solutions requires substantial redesign and optimization of both the memory cell for each node and the technology variant within each node.

MRAM is an excellent candidate technology for embedded non-volatile memory; it exhibits high speed and endurance and cross-technology-node compatibility. Existing thermally-assisted MRAM (TAS-MRAM) devices that can tolerate high temperature operation require more than two masks to embed.

Mask adders are lithography levels added to a standard chip fabrication process in order to incorporate additional functionality. A low number of mask adders may reduce the cost of fabrication and allow an increase in chip density.

BRIEF SUMMARY

Accordingly, one example aspect of the present invention is a thermally assisted magnetoresistive random access memory (TAS-MRAM) cell. The TAS-MRAM cell includes a first metal layer. The first metal layer includes a pad and a first metal line. The pad is not in direct contact with the first metal line. The TAS-MRAM cell also includes second metal layer. The second metal layer includes a second metal line and a metal strap. The second metal line is not in direct contact with the metal strap, and the second metal line is perpendicular to the first metal line. The TAS-MRAM cell includes an interlayer between the first metal layer and the second metal layer. The first metal line is not in direct contact with the interlayer. The first magnetic stack is in direct contact with both the interlayer and the metal strap. The TAS-MRAM cell also includes a first non-magnetic via in direct contact with both the pad and the metal strap.

Another aspect of the present invention is an array of thermally assisted magnetoresistive random access memory (MRAM) cells. The array includes a first metal layer. The first metal layer includes a plurality of pads and a plurality of first metal lines. None of the pads are in direct contact with any of the first metal lines. The array also includes a second metal layer. The second metal layer includes a plurality of second metal lines and a plurality of metal straps. None of the second metal lines are in direct contact with any of the metal straps. The second metal lines are perpendicular to the first metal lines. The array includes an interlayer between the first metal layer and the second metal layer. None of the first metal lines are in direct contact with the interlayer. The array also includes a plurality of first magnetic stacks in direct contact with the interlayer and the metal straps. Finally, the array includes a plurality of first vias in direct contact with the pads and the metal straps.

Yet another aspect of the present invention is a method for constructing an array of TAS-MRAM cells. The method includes depositing a first metal layer. The first metal layer includes a plurality of pads and a plurality of first metal lines. None of the pads are in direct contact with any of the first metal lines. The method also includes forming an interlayer over the first metal layer. None of the first metal lines are in direct contact with the interlayer. The method includes forming a plurality of first magnetic stacks in direct contact with the interlayer. The method also includes forming a plurality of first vias in direct contact with the pads. Finally, the method includes depositing a second metal layer over the interlayer. The second metal layer includes a plurality of second metal lines and a plurality of metal straps. None of the second metal lines are in direct contact with the metal straps. Each of the metal straps is in direct contact with one of the first magnetic stacks and one of the first vias. The second metal lines are perpendicular to the first metal lines.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIG. 6A shows a memory array containing TAS-MRAM cells. The view is a cross-sectional cut including one and a half TAS-MRAM cells, shown in the inset, and cuts across the metal strap, first magnetic stacks, and first non-magnetic vias of the circuit.

FIG. 6B shows a memory array containing TAS-MRAM cells. The view is a cross-sectional cut including one and a half TAS-MRAM cells, shown in the inset, and cuts across the second metal line, second magnetic stacks, and additional magnetic stacks of the circuit.

FIG. 6C shows a memory array containing TAS-MRAM cells. The view is a cross-sectional cut including one and a half TAS-MRAM cells, shown in the inset, and cuts across the edge of the cell.

DETAILED DESCRIPTION

Figure 1A:
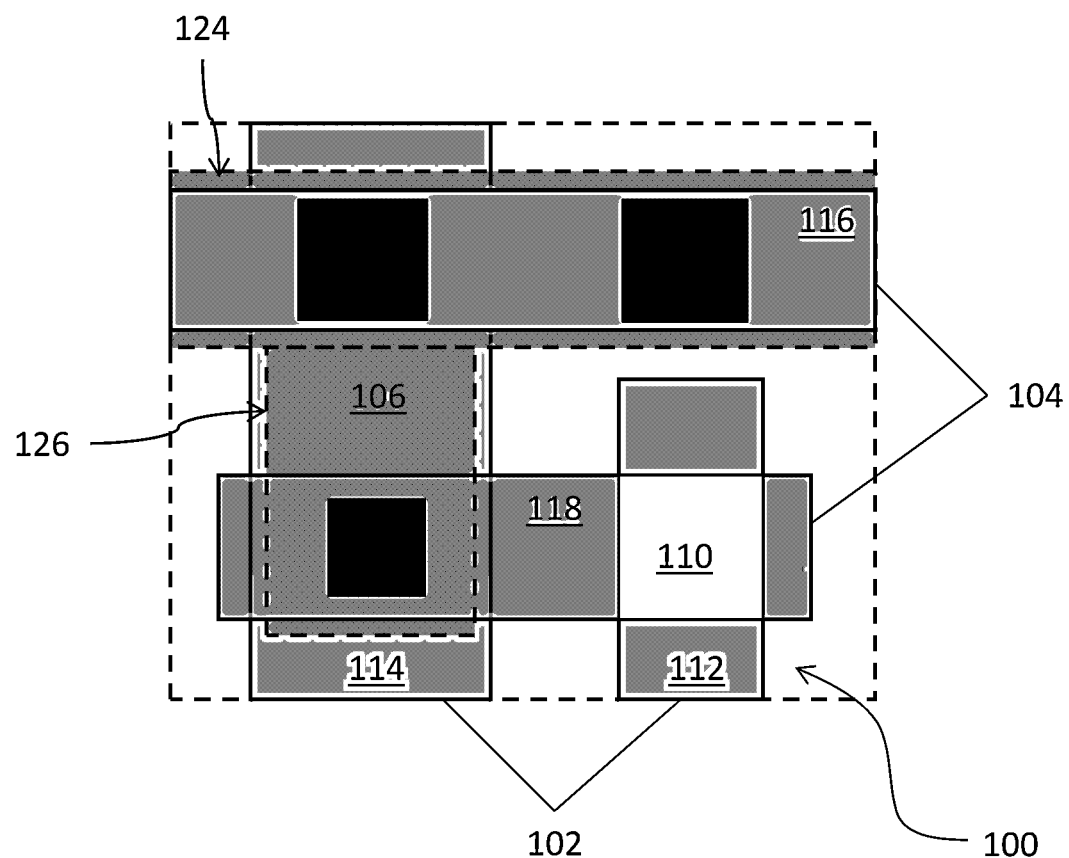
FIG. 1A shows a first example of a TAS-MRAM cell, in accordance with one embodiment of the invention.

The present invention is described with reference to embodiments of the invention. Throughout the description of the invention reference is made to FIGS. 1A-8. When referring to the figures, like structures and elements shown throughout are indicated with like reference numerals.

Figure 1B:
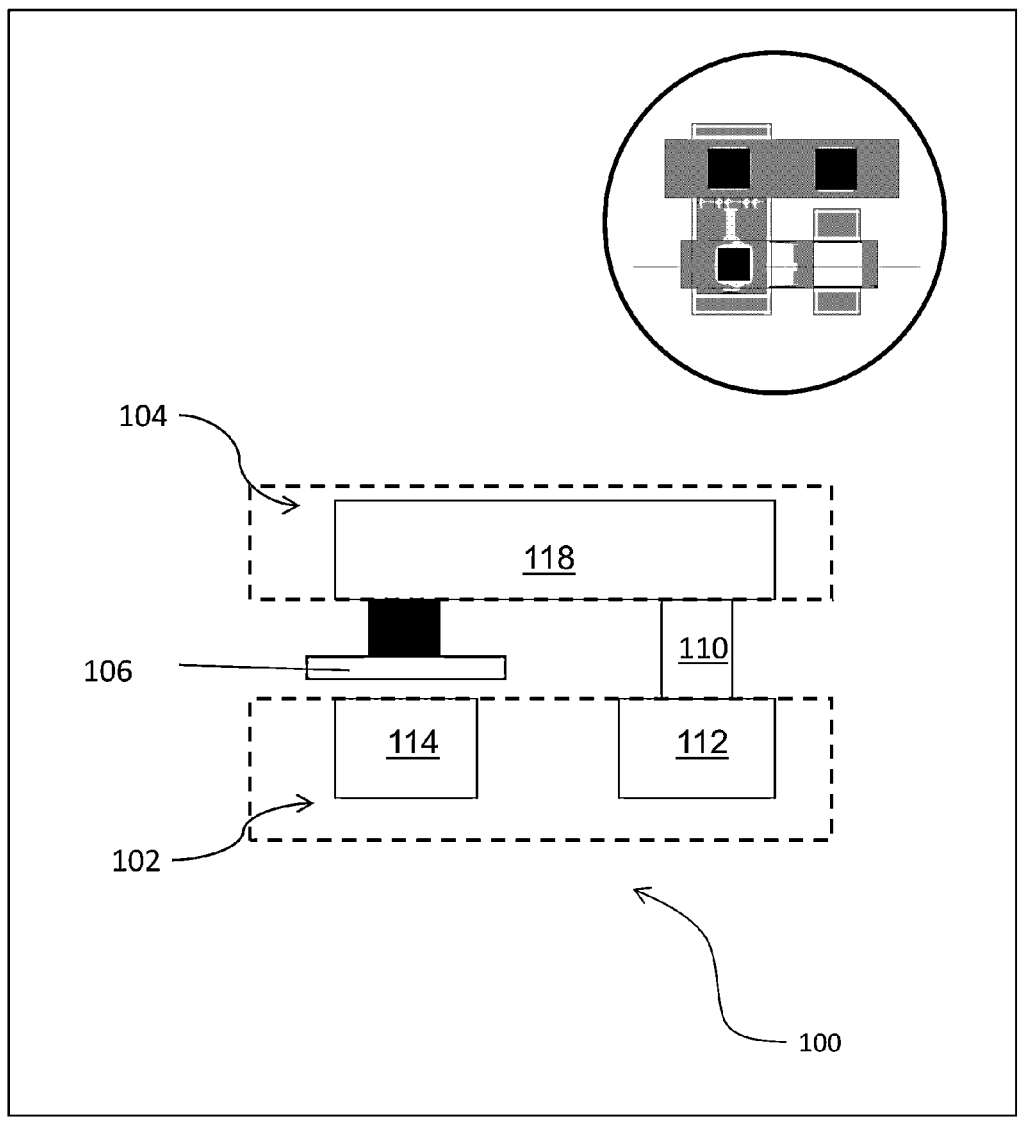
FIG. 1B shows a cross-sectional view of the TAS-MRAM cell of FIG. 1A. The cross-sectional cut, shown in the inset, cuts across the metal strap, first magnetic stack, and first non-magnetic via of the cell.
Figure 1C:
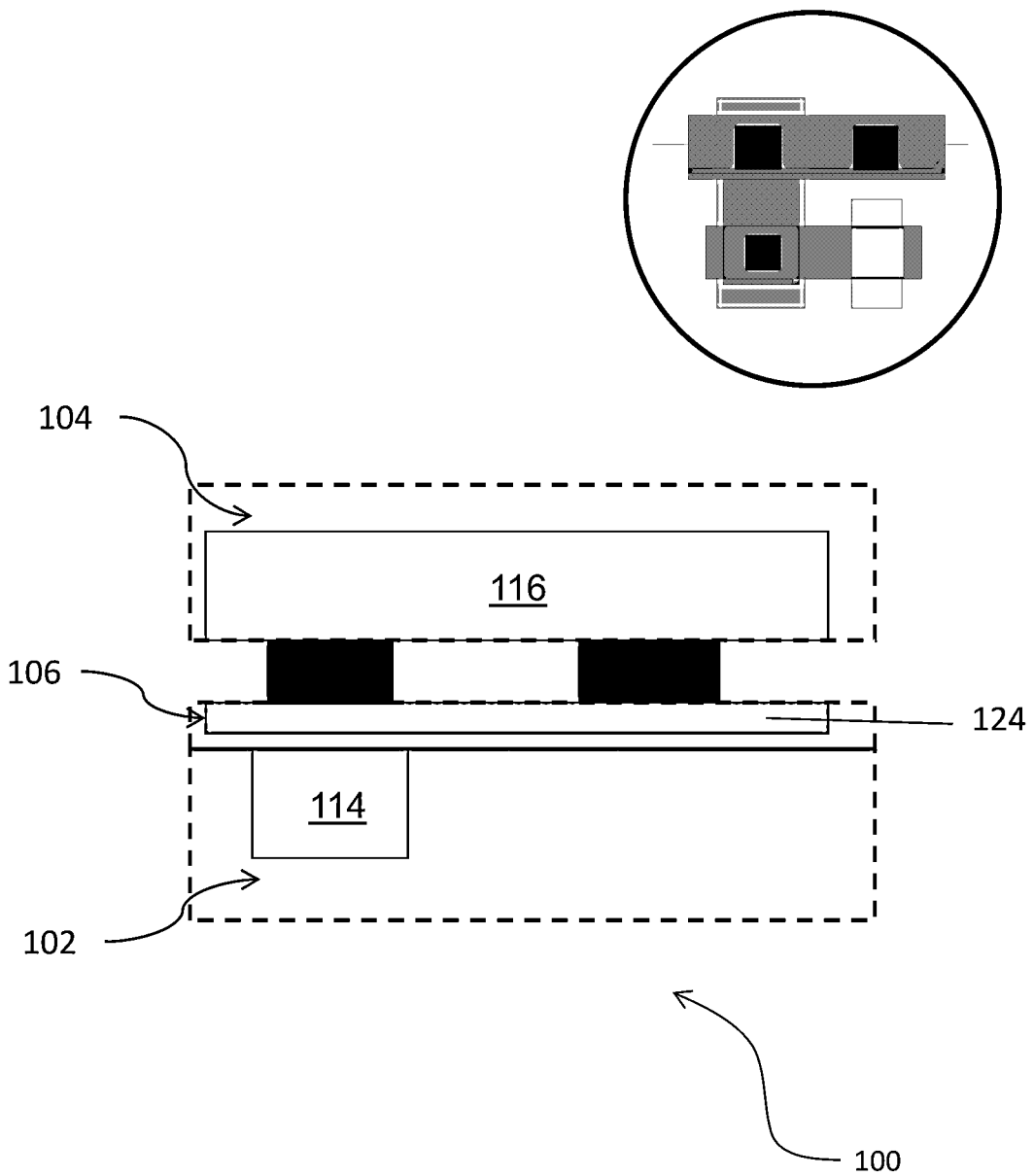
FIG. 1C shows a cross-sectional view of the TAS-MRAM cell of FIG. 1A. The cross-sectional cut, shown in the inset, cuts across the second metal line, second magnetic stack, and additional magnetic stack of the cell.

FIGS. 1A-1C show a thermally assisted magnetoresistive random access memory (MRAM) cell 100, according to one embodiment of the invention. The MRAM cell includes a first metal layer 102, a second metal layer 104, an interlayer 106, a first magnetic stack 108, and a first non-magnetic via 110.

The first metal layer 102 includes a pad 112 and a first metal line 114. The pad 112 is not in direct contact with the first metal line 114. The first metal line 114 may be parallel to the pad 112. The first metal line 114 and the pad 112 may contain may consist of a metal such as copper (Cu) or aluminum (Al). According to one embodiment of the invention, the first metal line 114 may extend to the edges of the MRAM cell.

The second metal layer 104 includes a second metal line 116 and a metal strap 118. The second metal line 116 is not in direct contact with the metal strap 118. Furthermore, the second metal line 116 is perpendicular to the first metal line. The second metal line 116 may be is parallel to the metal strap 118.

The second metal line 116 and the metal strap 118 may contain may consist of a metal such as copper (Cu) or aluminum (Al). According to one embodiment of the invention, the second metal line 116 may extend to the edges of the MRAM cell 100.

The interlayer 106 is located between the first metal layer 102 and the second metal layer 104. Furthermore, the first metal line 114 is not in direct contact with the interlayer 106. The interlayer 106 may be an electric conductor. In one embodiment of the invention, the interlayer 106 may possess lower electric conductivity than the first metal line 114. The interlayer may also possess lower electric conductivity than the second metal line 116.

In another embodiment of the invention, the interlayer 106 may be substantially T-shaped, with a bar 124 of the T-shaped interlayer aligned parallel to the second metal line 116. The bar 124 may extend to the edges of the MRAM cell 100. The other bar 126 of the T-shaped interlayer may be aligned perpendicular to the second metal line 116 and may not touch the edges of the MRAM cell 100. The interlayer may consist of an electric conductor such as tantalum (Ta), tantalum nitride (TaN), or tantalum silicon nitride (TaSiN).

According to yet another embodiment of the invention, the MRAM cell 100 may include an insulating layer between the first metal line 114 and the interlayer 106. The insulating layer may be a dielectric, approximately between 10 nm to 100 nm in thickness.

The first magnetic stack 108 is in direct contact with both the interlayer 106 and the metal strap 118. The first magnetic stack 108 may have a cross-sectional area measuring between 100 nm$^2$ and 250,000 nm$^2$.

The first non-magnetic via 110 is in direct contact with both the pad 112 and the metal strap 118.

According to one embodiment of the invention, the MRAM cell 100 may include a second magnetic stack 120, as shown in FIG. 1C. The second magnetic stack 120 is in direct contact with both the interlayer 106 and the second metal line 116. The first magnetic stack 108 and the second magnetic stack 120 may contain identical layers. However, the second magnetic stack 120 may have different dimensions than the first magnetic stack 108. For example, the second magnetic stack 120 may possess a larger cross-section than the first magnetic stack 108.

According to another embodiment of the invention, the MRAM cell may include one or more additional magnetic stacks other than the first and second magnetic stacks 108 and 120. These additional magnetic stacks may contain the same layers as the first magnetic stack 108. They may have different dimensions than the first magnetic stack 108, and may possess a larger cross-section than the first magnetic stack 108. The first, second, and additional magnetic stacks (108, 120, and 122) may have cross-sections of any shape, including a square, a rectangle, or a circle.

Figure 2:
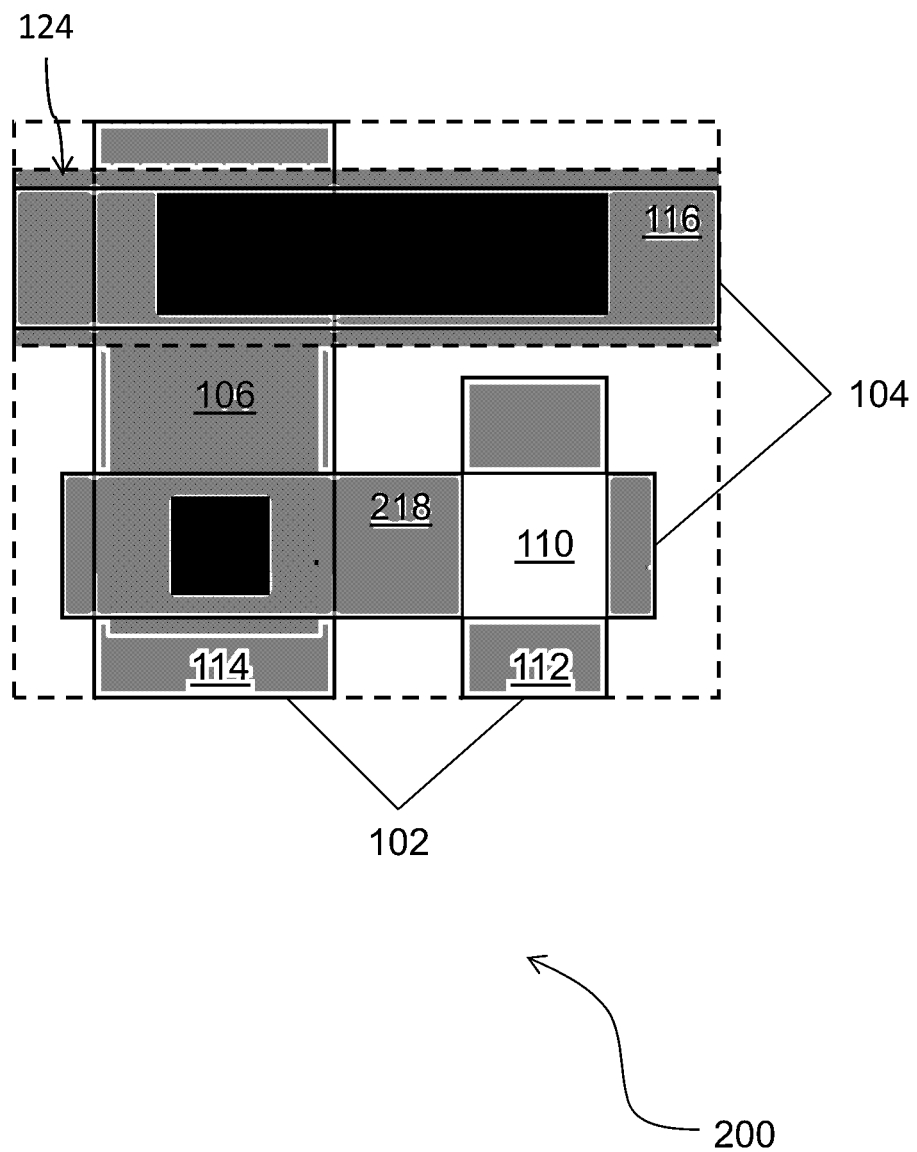
FIG. 2 shows a second example of a TAS-MRAM cell, according to another embodiment of the invention.

FIG. 2 shows a second example of a TAS-MRAM cell 200, according to second embodiment of the invention. The TAS-MRAM cell 200 includes a first magnetic stack 208 and a second magnetic stack 220. The second magnetic stack 220 of such an MRAM cell 200 may be elongated, with the elongation parallel to the second metal line.

Returning back to FIG. 1C, the MRAM cell 100 may include one or more additional magnetic stacks 122 other than the first magnetic stack 108 and the second magnetic stack 120, as shown in FIG. 1C. These additional magnetic stacks 122 are also in direct contact with both the interlayer 106 and the second metal line 116. The first, second, and additional non-magnetic vias may have cross-sections of any shape, including a square, a rectangle, or a circle.

According to yet another embodiment of the invention, the MRAM cell may include additional insulating layers surrounding the magnetic stacks and the non-magnetic vias. These additional insulating layers may contain electrically insulating material such as a silicon nitride (SiN) compound or a silicon oxide (SiO) compound, for example, tetraethyl orthosilicate (TEOS). The electrically insulating material may also include dielectrics with low dielectric constants (low-k dielectrics), spin-on dielectrics, or spin-on glasses.

Figure 3:
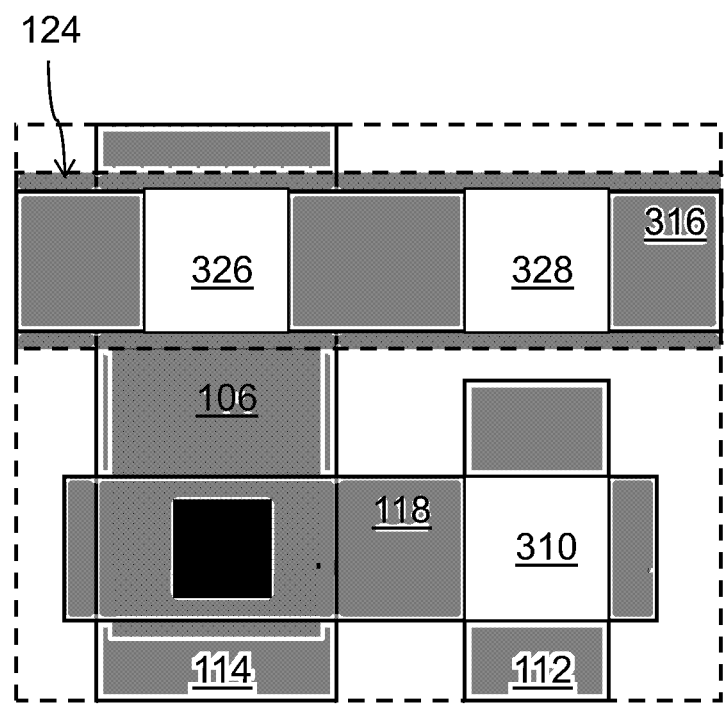
FIG. 3 shows a third example of a TAS-MRAM cell, according to yet another embodiment of the invention.
Figure 3:
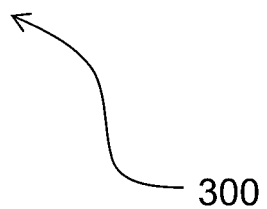

FIG. 3 shows a third example of a TAS-MRAM cell 300, according to yet another embodiment of the invention. The TAS-MRAM cell 300 includes a second non-magnetic via 326. The second non-magnetic via 326 is in direct contact with both the interlayer 304 and the second metal line 316.

According to another embodiment of the invention, the MRAM cell 300 may include one or more additional magnetic stacks 328 other than the first and second non-magnetic vias 310 and 326. These additional magnetic stacks 328 may contain the same layers as the first non-magnetic via 310. They may have different dimensions than the first non-magnetic via 310, and may possess a larger cross-section than the first non-magnetic via 310.

Figure 4:
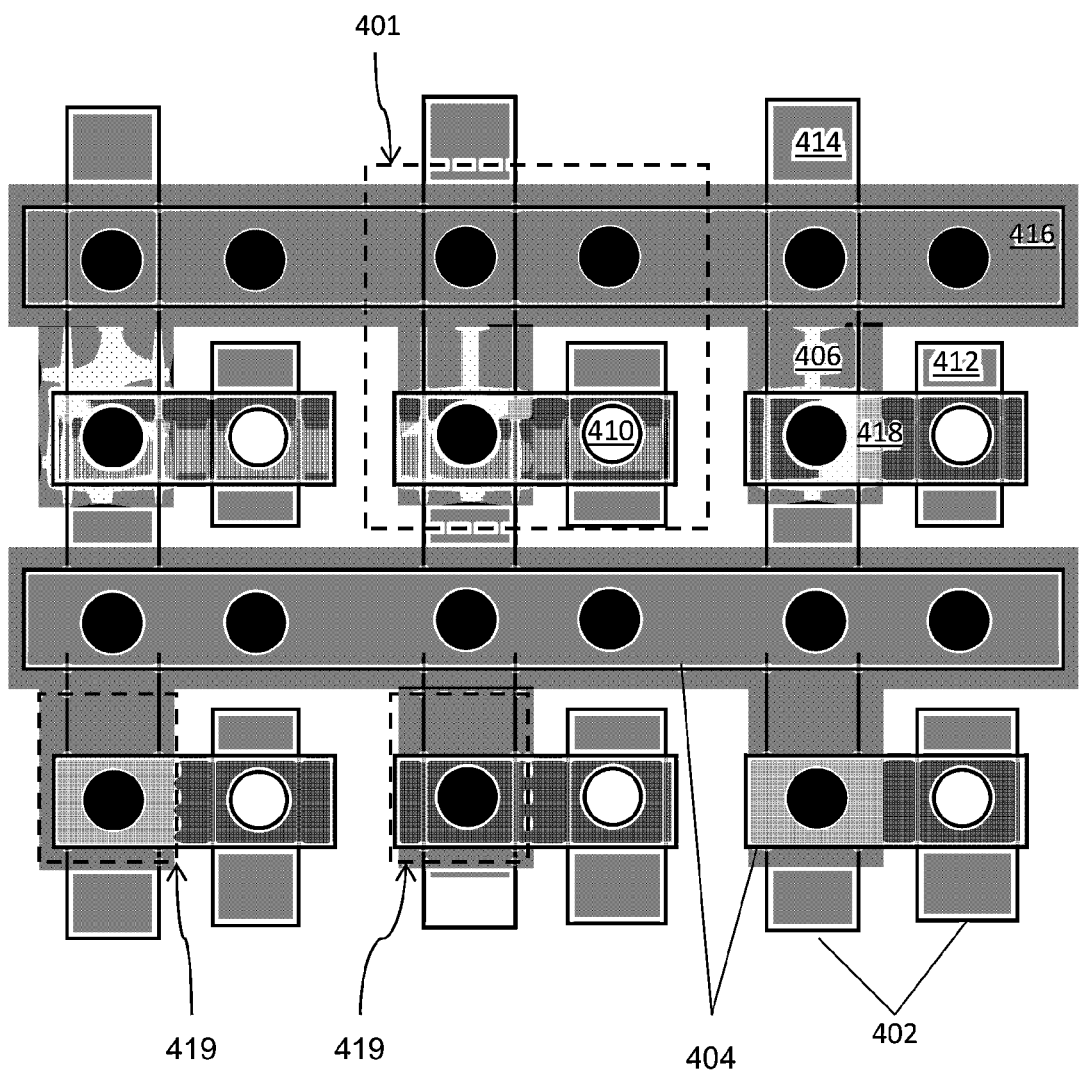
FIG. 4 shows a first example of an array of thermally assisted magnetoresistive random access memory (MRAM) cells, according to an embodiment of the invention.

FIG. 4 shows a first example of an array 400 of thermally assisted magnetoresistive random access memory (MRAM) cells 401, according to an embodiment of the invention. The array 400 includes a first metal layer 402, a second metal layer 404, an interlayer 406, a plurality of first magnetic stacks 408, and a plurality of first vias 410.

The first metal layer 402 includes plurality of pads 412 and a plurality of first metal lines 414. None of the pads 412 are in direct contact with any of the first metal lines 414. In one embodiment of the invention, the pads 412 are not in direct contact with each other.

The second metal layer 404 includes a plurality of second metal lines 416 and a plurality of metal straps 418. None of the plurality of second metal lines 416 are in direct contact with any of the plurality of metal straps 418. Furthermore, the second metal lines 416 are perpendicular to the first metal lines 414. In one embodiment of the invention, the metal straps 418 are not in direct contact with each other.

The interlayer 406 lies between the first metal layer 402 and the second metal layer 404. None of the first metal lines 414 are in direct contact with the interlayer 406. The interlayer 406 may be comb-shaped and contain a plurality of teeth 419. The teeth 419 may be aligned parallel to the plurality of second metal lines 416.

The plurality of first magnetic stacks 408 are in direct contact with the interlayer 406 and the metal straps 418.

The plurality of first vias 410 is in direct contact with the pads 412 and the metal straps 418.

According to one embodiment of the invention, the array 400 of thermally assisted MRAM cells may also include a plurality of second magnetic stacks 420. The plurality of second magnetic stacks 420 may be in direct contact with both the interlayer 406 and the second metal lines 416. The second magnetic stacks 420 may also have different dimensions than the first magnetic stacks 408.

According to another embodiment of the invention, the array 400 is a regular array of repeating thermally assisted MRAM cells 401. The first metal lines 414 and second metal lines 416 may be continuous across the array 400. However, the pads 412 and the metal straps 418 are not continuous.

Figure 5:
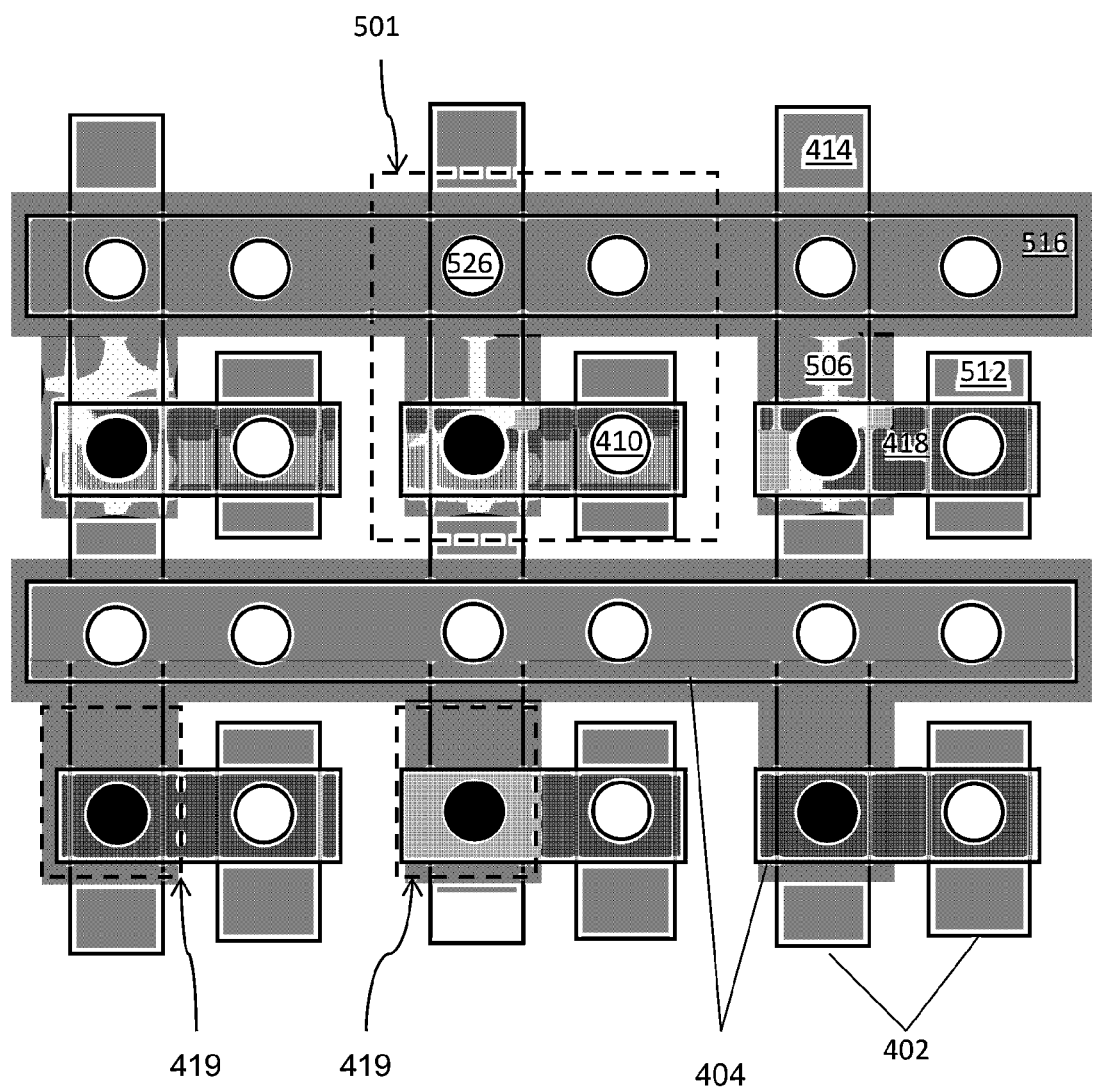
FIG. 5 also shows a second example of array of thermally assisted MRAM cells, according to another embodiment of the invention.

FIG. 5 also shows a second example of array 500 of TAS-MRAM cells 501, according to another embodiment of the invention. The array 500 includes a plurality of second vias 526. The second vias 526 may be in direct contact with the interlayer 506 and the second metal lines 516.

Figure 6A:
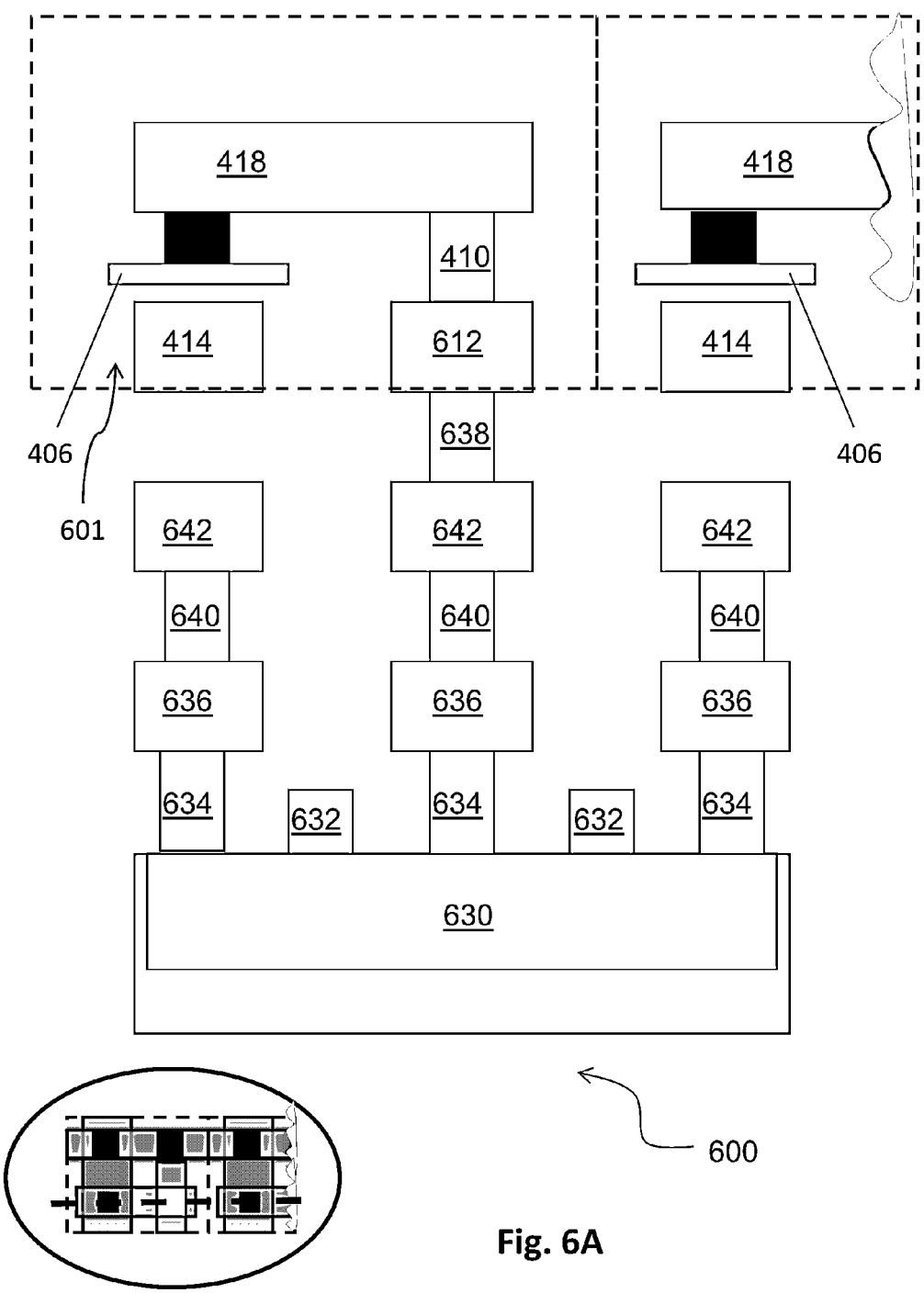
FIGS. 6A-6C show a memory array containing TAS-MRAM cells, in accordance with an embodiment of the invention.
Figure 6B:
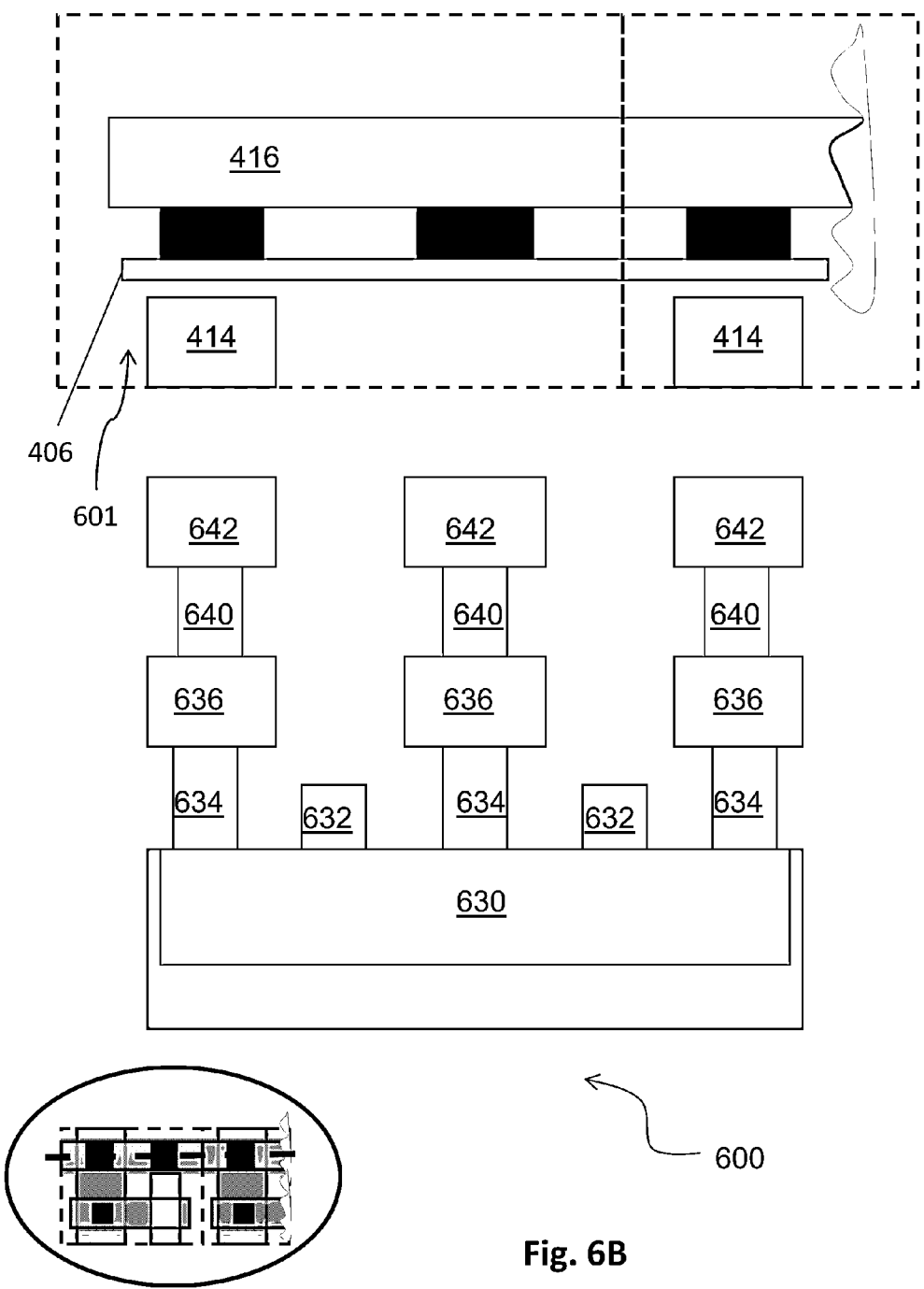
Figure 6C:
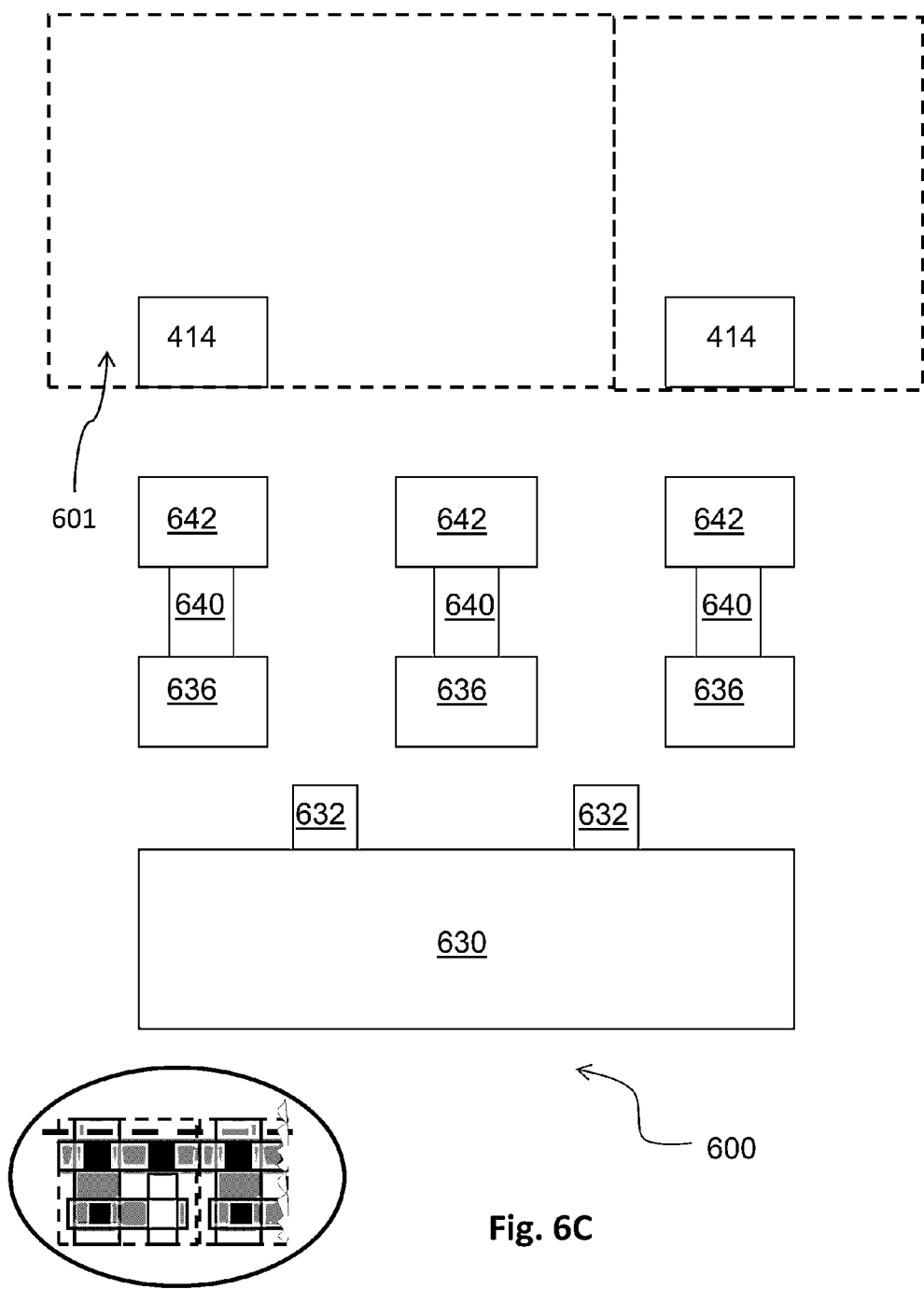

FIGS. 6A-6C show cross-sectional views a memory array 600 containing thermally assisted MRAM cells 601, in accordance with an embodiment of the invention. The thermally assisted MRAM cells 601 of the memory array 600 may be identical to the cell shown in FIGS. 1A-1C. The thermally assisted MRAM cell 601 of the transistor may also be identical to the cell shown in FIG. 2 or the cell shown in FIG. 3.

Each memory array 600 associated with a TAS-MRAM cell 601 also includes a substrate 630, at least two polysilicon gates 632, at least two first circuit vias 634, at least two first circuit metal lines 636, and at least one last circuit via 638. The first circuit vias 634 are in direct contact with the substrate 630 and the first circuit metal lines 636. The last circuit via 638 is in direct contact with the pad 612. The polysilicon gates 632 and first circuit metal lines 636 may extend to the edges of the thermally assisted MRAM cell 601. The first circuit vias 634 of the memory array 600 are not in direct contact each other. The last circuit vias 638 of the memory array 600 are also not in direct contact with each other.

According to one embodiment of the invention, the memory 600 associated with a TAS-MRAM cell 601 may also include at least two second circuit vias 640 and at least two second circuit metal lines 642. The second circuit vias 642 are in direct contact with the first circuit metal lines 636. The last circuit via 638 is in direct contact with one the second circuit metal lines 642 and the pad 612. The second circuit vias and the second circuit metal lines may extend to the edges of the thermally assisted MRAM cell 601.

According to another embodiment of the invention, the memory array 600 associated with a TAS-MRAM cell 601 may include at least one additional circuit via in direct contact with the second circuit metal line 642 and at least two additional circuit metal lines, one of which may be in direct contact with the last circuit metal via 638 and an additional circuit metal line.

Figure 7:
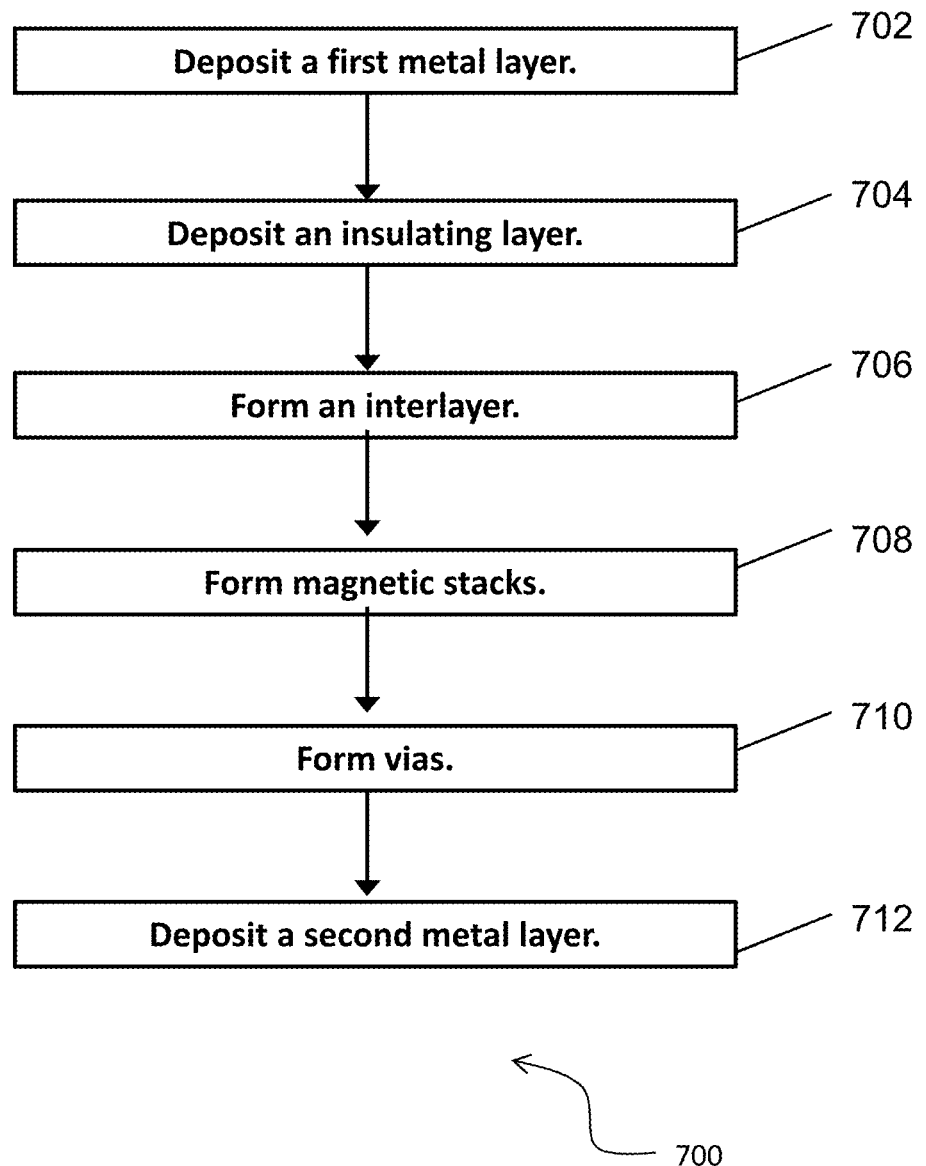
FIG. 7 shows a first example method for constructing an array of thermally assisted MRAM cells contemplated by the present invention.

FIG. 7 shows a first example method 700 for constructing an array of thermally assisted MRAM cells contemplated by the present invention.

The method begins with the deposition of a first metal layer 702. At the deposition of the first metal layer 702, a metal is used to form the first metal layer. The metal may be copper (Cu) or aluminum (Al).

The first metal layer includes pads and first metal lines. None of the pads are in direct contact with any of the first metal lines. In one embodiment of the invention, the pads are not in direct contact with each other. After the first metal layer is deposited, the method proceeds to the deposition of an insulating layer 704.

At the deposition of an insulating layer 704, an electrically insulating material is deposited over the first metal layer. The electrically insulating material may include a silicon nitride (SiN) compound or a silicon oxide (SiO) compound, for example, tetraethyl orthosilicate (TEOS). The electrically insulating material may also include dielectrics with low dielectric constants (low-k dielectrics), spin-on dielectrics, or spin-on glasses.

According to another embodiment of the invention, the first insulating layer may be a dielectric, with a thickness of between 10 nm to 100 nm.

After the deposition of a first insulating layer 704, the method proceeds to the formation of an interlayer 706. At the deposition of the interlayer 706, the interlayer may be formed by first depositing a thin film of interlayer material over the first insulating layer and subsequently patterning the film to form the interlayer.

In another embodiment of the invention, the interlayer may also be formed using a damascene process. The damascene process may involve the following: first, depositing a new dielectric layer over the first insulating layer; second, etching the new dielectric layer; third, depositing interlayer material over the etched layer; and subjecting the interlayer material to a chemical mechanical polish to in order to form the interlayer.

None of the first metal lines are in direct contact with the interlayer. In one embodiment of the invention, the interlayer may be comb-shaped and contain teeth. The teeth may be aligned parallel to the second metal lines.

The interlayer material may consist of an electric conductor such as tantalum (Ta), tantalum nitride (TaN), or tantalum silicon nitride (TaSiN).

After the formation of the interlayer 706, the method proceeds to formation of magnetic stacks 708. At the formation of magnetic stacks 708, the first magnetic stacks are formed so that they are in direct contact with the interlayer. In one embodiment of the invention, second magnetic stacks and any additional magnetic stacks may also be formed simultaneously with the formation of the first magnetic stacks. The second magnetic stacks and any additional magnetic stacks may be formed so that they are in direct contact with the interlayer.

An exemplary method for the fabrication of magnetic stacks is described in T. Osada et al. DPS 2004: 26$^{th}$ Int. Symp. Dry Process, paper P-22, Tokyo, Japan (2004), the entire contents of which are specifically incorporated herein by reference.

After the formation of magnetic stacks 708, the method proceeds to the formation of vias 710. At the formation of the vias 710, the first vias are formed so that they are in direct contact with the pads. In one embodiment of the invention, second vias and any additional vias may be formed simultaneously with the formation of the first vias. The second vias and any additional vias may be formed so that they are in direct contact with the interlayer.

According to one embodiment of the invention, the formation of the vias 710 involves an etching step that would penetrate any existing insulating layers, but would not the interlayer. The etching step may then be followed by the deposition of via material in order to form the vias. Via material may be selected so that the vias within a thermally assisted MRAM cell are less conductive than the first magnetic stack.

After the formation of vias 710, the method proceeds to the deposition of the second metal layer 712. At the deposition of the second metal layer 712, a metal is used to form the second metal layer. The metal may be copper (Cu) or aluminum (Al).

The second metal layer contains second metal lines and metal straps. None of the second metal lines are in direct contact with any of the plurality of metal straps. Each of the metal straps is in direct contact with one of the first magnetic stacks and one of the first vias. Furthermore, the second metal lines are perpendicular to the first metal lines.

In one embodiment of the invention, the second metal lines may be in direct contact with the second magnetic stacks and any additional magnetic stacks.

In another embodiment of the invention the second metal lines may be in direct contact with the second vias and any additional vias. In yet another embodiment of the invention, the metal straps are not in direct contact with each other.

Figure 8:
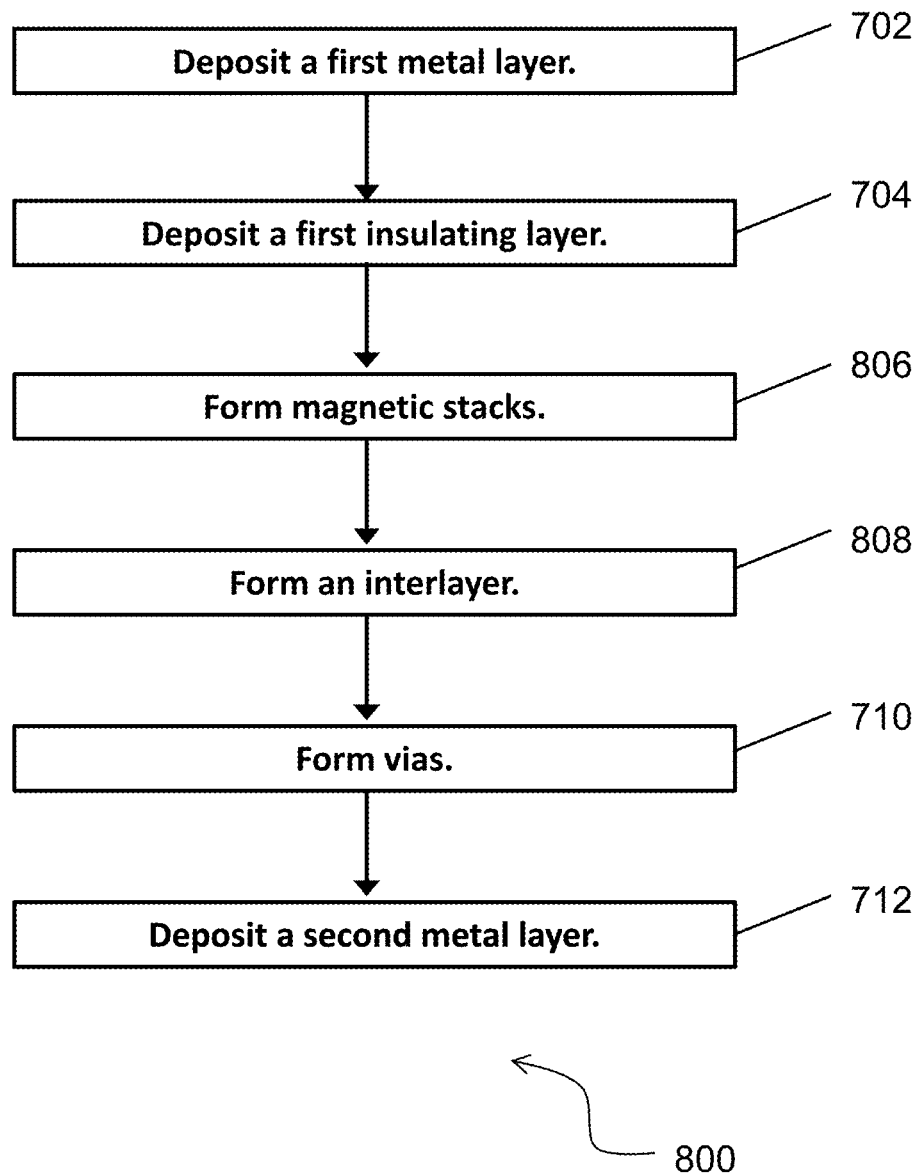
FIG. 8 shows a second example method for constructing an array of thermally assisted MRAM cells contemplated by the present invention.

FIG. 8 shows a second example method 800 for constructing an array of thermally assisted MRAM cells contemplated by the present invention. The second example method is similar to the first example method shown in FIG. 7. However, in the second example method, the formation of magnetic stacks 806 occurs prior to the formation of an interlayer 808.

At the formation of magnetic stacks 806, subtractive etch processes may be used to form the magnetic stacks. In one embodiment of the invention, liftoff processes may also be used to form the magnetic stacks. After formation of magnetic stacks 806, the method proceeds to formation of an interlayer 808.

At the formation of an interlayer 808, subtractive etch processes may be used to form the interlayer. In one embodiment of the invention, liftoff processes may also be used to form the interlayer.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for constructing an array of thermally assisted magnetoresistive random access memory (MRAM) cells, the method comprising:
   depositing a first metal layer, the first metal layer including a plurality of pads and a plurality of first metal lines, wherein none of the plurality of pads are in direct contact with any of the plurality of first metal lines;
   forming an interlayer over the first metal layer, wherein the none of plurality of first metal lines are in direct contact with the interlayer;
   forming a plurality of first magnetic stacks in direct contact with the interlayer;
   forming a plurality of first vias in direct contact with the pads;
   depositing a second metal layer over the interlayer, the second metal layer including a plurality of second metal lines and a plurality of metal straps, wherein none of the second metal lines are in direct contact with any of the metal straps, each of the metal straps is in direct contact with one of the first magnetic stacks and one of the first vias, and the plurality of second metal lines are perpendicular to the first metal lines.

2. The method of claim 1, further comprising forming a plurality of second magnetic stacks in direct contact with the interlayer and the second metal lines, the second magnetic stacks having different dimensions than the first magnetic stacks.

3. The method of claim 1, further comprising forming a plurality of second vias in direct contact with the interlayer and the second metal line.

4. The method of claim 1, wherein the plurality of pads are not in direct contact with each other.

5. The method of claim 1, wherein the plurality of metal straps are not in direct contact with each other.

6. The method of claim 1, wherein the interlayer is comb-shaped.

7. The method of claim 6, wherein the interlayer contains a plurality of teeth, and the plurality of teeth are aligned parallel to the plurality of second metal lines.

* * * * *